(12) United States Patent
Alley et al.

(10) Patent No.: US 8,768,635 B2
(45) Date of Patent: Jul. 1, 2014

(54) SYSTEMS AND METHODS FOR DETERMINING ELECTRICAL FAULTS

(75) Inventors: Daniel Milton Alley, Salem, VA (US); Parag Vishwanath Acharya, Hyderabad (IN)

(73) Assignee: General Electric Company, Schenectady, NY (US)

( * ) Notice: Subject to any disclaimer, the term of this patent is extended or adjusted under 35 U.S.C. 154(b) by 425 days.

(21) Appl. No.: 13/116,869

(22) Filed: May 26, 2011

(65) Prior Publication Data

US 2012/0303297 A1 Nov. 29, 2012

(51) Int. Cl.
*G01R 31/00* (2006.01)
*G01R 31/14* (2006.01)
*H02H 3/00* (2006.01)

(52) U.S. Cl.
USPC .............................. 702/58; 324/509; 361/42

(58) Field of Classification Search
USPC ............... 702/58, 57, 59, 64–65, 81, 84, 108, 702/117–118, 127, 182–183, 185, 189; 324/500, 509, 512, 522–523, 525, 527, 324/537; 700/286, 292–293; 361/15, 18, 361/42, 93.7
See application file for complete search history.

(56) References Cited

U.S. PATENT DOCUMENTS

| | | | |
|---|---|---|---|
| 5,481,194 A * | 1/1996 | Schantz et al. | 324/522 |
| 6,135,085 A | 10/2000 | Toyohara et al. | |
| 7,019,532 B2 | 3/2006 | Glockner et al. | |
| 2008/0084323 A1 | 4/2008 | Stad et al. | |
| 2008/0269970 A1 | 10/2008 | Yamada | |
| 2012/0299598 A1 * | 11/2012 | Alley et al. | 324/509 |

* cited by examiner

*Primary Examiner* — Toan Le
(74) *Attorney, Agent, or Firm* — Sutherland Asbill & Brennan LLP

(57) ABSTRACT

Certain embodiments of the invention may include systems and methods for determining electrical faults. According to an example embodiment of the invention, a method is provided for determining electrical faults. One method can include providing switch circuitry including at least one first switch detector resistor in parallel communication with at least one switch; providing terminal board circuitry including at least one terminal board resistor in parallel communication with the switch circuitry and in communication with a power source; receiving a power source reference; comparing a field voltage value to a generated reference voltage value, generating a comparison value output based at least in part on the comparison of the field voltage value and the generated reference voltage; and determining one of a plurality of field conditions based at least in part on the comparison value output.

20 Claims, 4 Drawing Sheets

SYSTEMS AND METHODS FOR DETERMINING ELECTRICAL FAULTS

FIELD OF THE INVENTION

This invention generally relates to detecting electrical faults, and in particular, to detecting fault conditions associated with contact or switch wiring.

BACKGROUND OF THE INVENTION

Remote switches are often used in industrial systems for determining a state or condition associated with machinery. The remote switches can be in an open or closed position, and the switch position can be communicated to control electronics, usually by long interconnecting cables, which typically contain a pair of wires for each switch. One problem associated with such remote switching and sensing systems is that the wiring associated with the interconnecting cables can become damaged, resulting in an open connection, or wires that are shorted to each other and/or to earth or chassis ground. If a wire to a remote switch is broken, the switch may appear to the control circuitry as being in an open position. If a pair of wires becomes shorted, the switch may appear to the control circuitry as being in a closed position. If a wire is shorted to ground, leakage current may mislead the sensing circuit. If the wires are damaged, the control system may receive a wrong signal, and a wrong decision may be made based on the wrong signal.

BRIEF SUMMARY OF THE INVENTION

Some or all of the above needs may be addressed by certain embodiments of the invention. Certain embodiments of the invention may include systems and methods for determining electrical faults.

According to an example embodiment of the invention, a method is provided for monitoring electrical faults. The method includes delivering a field voltage value to voltage comparison circuitry, wherein the field voltage value is based at least in part on a voltage communicated from at least one terminal board resistor in parallel communication with switching circuitry; delivering a generated reference voltage value to the voltage comparison circuitry; and determining at least one of a plurality of field conditions based at least in part on an output of the voltage comparison circuitry.

According to another example embodiment, another method is provided for determining electrical faults. The method includes providing switch circuitry comprising at least one first switch detector resistor in parallel communication with at least one switch; providing terminal board circuitry comprising at least one terminal board resistor in parallel communication with the switch circuitry and in communication with a power source; receiving a power source reference; comparing, by voltage comparison circuitry, a field voltage value based on a field voltage that represents voltage communicated from the switch circuitry and the terminal board circuitry to a generated reference voltage value, wherein the generated reference voltage value is based at least in part on the power source reference; generating a comparison value output based at least in part on the comparison of the field voltage value and the generated reference voltage; and determining one of a plurality of field conditions based at least in part on the comparison value output.

According to another example embodiment, a system is provided for determining electrical faults. The system includes switch circuitry comprising at least one first switch detector resistor in parallel communication with at least one switch; terminal board circuitry comprising at least one terminal board resistor in parallel communication with the switch circuitry and in communication with a power source; acquisition board circuitry comprising voltage comparison circuitry operable to receive a generated reference voltage value as a first input and a field voltage value as a second input and to output a comparison value, wherein the field voltage value represents voltage communicated from the switch circuitry and the terminal board circuitry; and a controller comprising at least one processor and instructions. The controller is adapted to receive a power source reference; control the generated reference voltage value to the voltage comparison circuitry based at least in part on the power source reference; receive the comparison value output from the voltage comparison circuitry; and determine one of a plurality of field conditions based at least in part on the comparison value.

Other embodiments and aspects of the invention are described in detail herein and are considered a part of the claimed invention. Other embodiments and aspects can be understood with reference to the following detailed description, accompanying drawings, and claims.

BRIEF DESCRIPTION OF THE FIGURES

Reference will now be made to the accompanying tables and drawings, which are not necessarily drawn to scale, and wherein.

DETAILED DESCRIPTION OF THE INVENTION

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Certain example embodiments of the invention may enable detection of open, shorted, and/or ground fault wire conditions associated with a remote switch.

According to certain example embodiments, detecting open wires within a contact input system may include using circuitry that can detect a broken signal wire within a ribbon cable between a terminal board and a control board, for example, and/or a broken wire between the terminal board and the field wired switch. Example embodiments of the invention may also be utilized to detect ground fault conditions.

Various resistors, comparison circuits, controllers, etc. may be utilized for detecting the electrical faults, according to example embodiments of the invention, and will now be described with reference to the accompanying figures.

Figure 1:
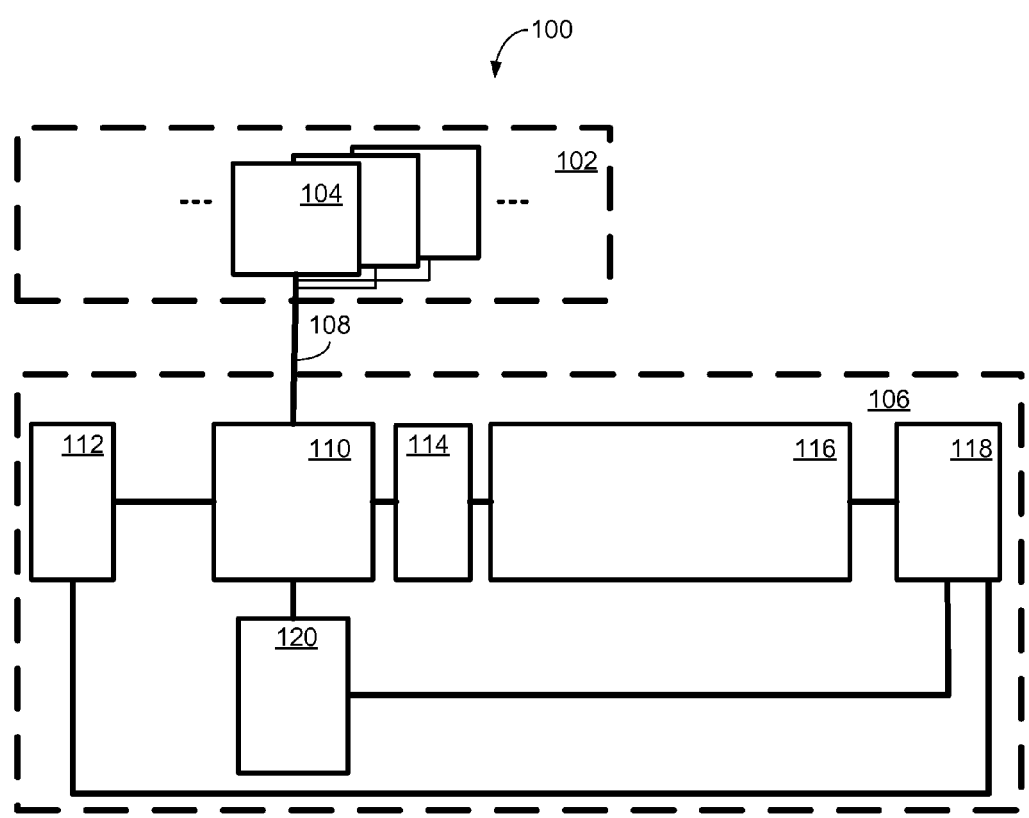
FIG. 1 is a block diagram of an illustrative electrical fault detection system, according to an example embodiment of the invention.

FIG. 1 depicts an electrical fault detection system 100, according to an example embodiment of the invention. In an example embodiment, the system 100 may include a plant 102 with one or more associated switches and circuitry 104. For example, the plant 102 may include machinery or other devices that may interact with the switches and circuitry 104. In an example embodiment, the system 100 may also include a control system 106. In an example embodiment, the control system 106 may be located remotely from the switches and circuitry 104. According to an example embodiment, cables 108 may connect the switches and circuitry 104 to the control system 106.

According to an example embodiment of the invention, the control system 106 may include a terminal board 110 and associated circuitry, which may be used, at least in part, for connecting the cables 108 from the remote switches and circuitry 104 to the control system 106. The control system 106 may also include a battery or power supply 112 that may be in communication with the terminal board 110, and which may be utilized for providing a reference voltage for sensing the condition of the remote switches and circuitry 104. Example embodiments of the control system 106 may include internal interconnections 114, which may include, connectors, wires, ribbon cable, etc., for connecting to an acquisition circuit 116. According to an example embodiment, the acquisition circuit 116 may be in communication with a controller 118, which may include one or more microprocessors, programmable systems on a chip, etc. According to an example embodiment, the battery/power supply 112 may be in communication with the controller 118 and/or the acquisition circuit 116. In an example embodiment, the control system 106 may include ground leakage detection circuitry 120 in communication with the terminal board 110 and the controller 118.

Figure 2:
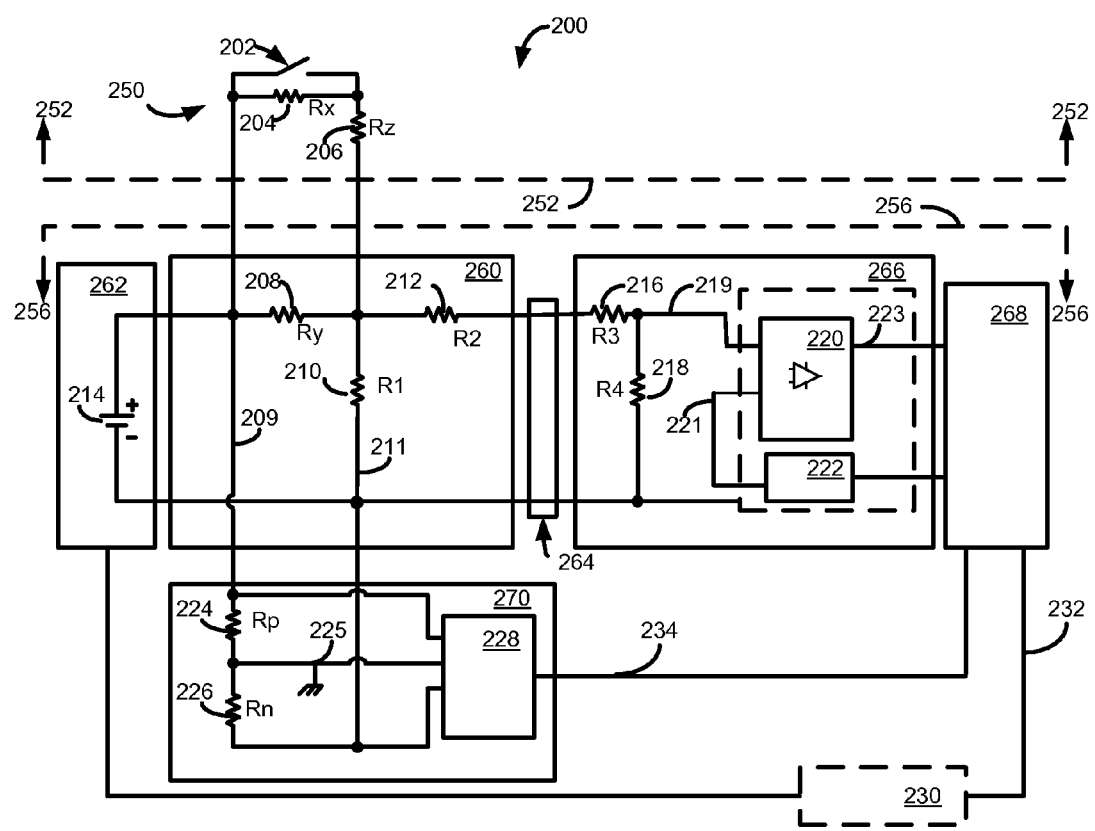
FIG. 2 is a schematic diagram of an illustrative fault detection circuit and system, according to an example embodiment of the invention.

FIG. 2 is a schematic drawing of an example fault detection circuit 200, in which certain blocks may correspond to respective blocks of FIG. 1. According to an example embodiment, the fault detection circuit 200 may include one or more switches and associated circuitry 250. According to an example embodiment, the fault detection circuit 200 may include a switch 202. In an example embodiment, a resistor Rx 204 may be placed in a parallel connection with the switch 202 so that a small amount of current may flow through the resistor Rx 204 when the switch 202 is open. According to an example embodiment, a resistor Rz 206 may be placed in series with the switch 202, primarily for detecting when the switch 202 is closed and for providing a small voltage drop which may be used to distinguish between a shorted cable and the closed switch 202.

According to an example embodiment, the switch 202, associated with parallel resistor Rx 204, and series resistor Rz 206 may be located remotely from the control system 256, and may be connected to a terminal board circuit 260 by one or more cables. In an example embodiment, the terminal board circuit 260 may include a resistor Ry 208 in parallel with the switch 202. In an example embodiment, the terminal board circuit 260 may also include a series branch resistor R1 210 in series with series resistor Rz 206 and leading to a circuit ground connection 211. In an example embodiment, the terminal board circuit 260 may also include a series branch resistor R2 212 in series with series resistor Rz 206, leading to an acquisition board circuit 266.

According to an example embodiment, one lead (for example, a positive lead) of a power supply 262 or battery 214 may be connected with the terminal board circuit 260, the resistor Ry 208, the parallel resistor Rx 204, and the switch 202. In an example embodiment, another lead of the power supply 262 (for example, the negative lead) of the power supply 262 may be connected to the ground circuit connection 211. In an example embodiment, the terminal board circuit 260 may be in communication with an acquisition board circuit 266 via an internal interconnection 264, such as a ribbon cable.

According to an example embodiment of the invention, the acquisition board circuit 266 may include a series resistor R3 216 in series communication with resistor R2 212 of the terminal board circuit 260. In an example embodiment, a resistor R4 218 may form a series circuit with resistor R3 216 and ground circuit connection 211. In an example embodiment, a voltage divider network may be established with the combination of resistors R4 218 and R3 216, so that a sensing input voltage 219 may be present on an input of a comparator 220. According to an example embodiment, a digital-to-analog converter (DAC) 222 may receive a signal from a controller 268 (for example, a PWM signal or other digital signal), and the DAC 222 may provide a reference voltage value input 221 on the comparator 220 for comparing with the sensing input voltage 219. In an example embodiment, the comparison value output 223 of the comparator 220 may be provided to the controller 268 for evaluation. In another example embodiment, the controller 268 may include its own internal circuitry for providing a reference voltage value input 221 to the comparator 220, eliminating the need for the DAC 222. Yet in another example embodiment, the controller 268 may include all of the necessary circuitry required for evaluating the sensing input voltage 219, for determining its value relative to reference values, and for evaluating the condition of the various connections and cables associated with the switch 202. In this example embodiment, the external comparator 220 and the DAC 222 may be eliminated or bypassed (as indicated by the dashed box surrounding the comparator 220 and the DAC 222), and the controller 268 may directly process the sensing input voltage 219.

According to an example embodiment, the power supply 262 circuit may also be in communication with the controller 268, for establishing a baseline reference value 232 for which the controller 268 may evaluate sensing input voltages 219 or comparison value output 223. For example, since the various voltages associated with the switch 202, associated circuitry 250, cables, and various resistors 208, 210, 212, 216, 218 are ultimately derived from the voltage of the battery 214 or power supply 262, the comparison voltage levels produced or read by the controller 268 may be based on the voltage of the battery 214 or power supply 262, so that as the battery 214 or power supply 262 voltage fluctuates, the comparison voltage levels can scale accordingly.

In an example embodiment, an optional power supply voltage interface circuit 230 may be utilized between the power supply 262 and the controller 268. In an example embodiment, the optional power supply voltage interface circuit 230 may include an analog-to-digital converter operable for sensing the analog voltage of the power supply 262, and presenting a digital signal 232 for the controller 268. However, as indicated above, if the controller 268 includes the requisite on-board circuitry for analog input, the optional power supply voltage interface circuit 230 may not be required (as indicated by the dashed box surrounding the optional power supply voltage interface circuit 230).

According to an example embodiment of the invention, the fault detection circuit 200 may include a ground leakage detection circuit 270 that may be utilized to detect when one or more conductors associated with the switches (for example, as in cables 108 of FIG. 1, or internal interconnection 264 of FIG. 2) come into contact with earth ground or chassis ground. In an example embodiment, the ground leakage detection circuit 270 may be in communication with a first field conductor 209, which may be tied to the positive lead of the power supply 262, and may be in communication with the switch 202. In an example embodiment, the first field conductor 209 may be connected to one end of a resistor Rp 224. In an example embodiment, the other end of the resistor Rp 224 may be connected to earth and/or chassis ground 225. In an example embodiment, the first field conductor 209 may also be connected to a positive input of a leakage comparator circuit 228, which according to an example embodiment, may include an analog-to-digital converter. In an example embodiment, the leakage comparator circuit 228 may include an operational amplifier that may provide an output proportional to a differential voltage on the inputs.

According to an example embodiment, the ground leakage detection circuit 270 may include a resistor Rn 226 tied to earth and/or chassis ground 225 on one end, and to the second field conductor 211 on the other end. According to an example embodiment, the second field conductor 211 may be tied to the negative lead of the battery 214. According to an example embodiment, the second field conductor 211 may also be tied to a negative input of the leakage comparator circuit 228. According to an example embodiment, the ground leakage detection circuit 270 may provide an ground leakage signal 234 representative of a differential voltage presented on the inputs (209, 211) to the leakage comparator circuit 228. For example, in a normal operation of the circuit, where no switch wires are shorted to earth or chassis ground, the differential voltage presented on the inputs (209, 211) of the leakage comparator circuit 228 may be approximately equal to the power supply 262 voltage. If, however, a portion of the circuit in communication with the first field conductor 209 comes into contact with ground, the voltage on the first field conductor 209 may drop to the approximate ground potential. According to an example embodiment, if the second field conductor 211 is not in contact with earth and/or chassis ground 225, the result may be that the power supply 262 will be referenced at earth or chassis ground on the positive lead or the first field conductor 209, and the negative lead or the second field conductor 211 will now be pushed below ground voltage, and current may flow from earth and/or chassis ground 225 through resistor Rn 226, creating a net negative voltage with respect to ground 225 on the second field conductor 211. In accordance with an example embodiment, this condition may present a negative differential voltage across the inputs of the leakage comparator circuit 228, and hence, the ground leakage signal 234 may be indicative of the grounded first field conductor.

According to another example embodiment, the second field conductor 211 may come into contact with earth and/or chassis ground 225, and in this case, the differential in potential between the normal (ungrounded) second field conductor 211 (i.e., negative power supply potential) and a grounded second field conductor 211 may be detectable detectable by virtue of leakage current flowing (or not flowing) through resistor Rn 226, and such current may alter the potential presented on the negative input of the leakage comparator circuit 228.

According to an example embodiment, if both the first field conductor 209 and the second field conductor 211 come into contact with earth and/or chassis ground 225, or with each other (independent of ground), the differential voltage presented to the inputs of the leakage comparator circuit 228 may different than zero. Therefore, according to example embodiments of the invention, the ground leakage dection circuit 270 may be able to distinguish between at least three ground fault conditions: (1) first field conductor 209 shorted to earth and/or chassis ground 225; (2) second field conductor 211 shorted to earth and/or chassis ground 225; and/or both the first field conductor 209 and the second field conductor 211 shorted to earth and/or chassis ground 225 or to each other.

According to an example embodiment of the invention, the leakage comparator circuit 228 may include an optional analog-to-digital converter for converting the ground leakage signal 234 to a digital format for reading by the controller 268. In another example embodiment, the leakage comparator circuit 228 may include analog components, and the ground leakage signal 234 may be analog if the controller 268 includes the requisite components for interfacing and converting analog signals for processing or reading by the controller 268 or the controller's microprocessor.

Returning now to the overall fault detection circuit 200, in an example embodiment, different relative voltage levels presented at the sensing input voltage 219 may indicate a corresponding condition associated with the various wiring associated with the switch 202. For example, and depending on the choice of values selected for the various resistors (204, 206, 208, 210, 212, 216, 218) a value of approximately 60% of the full power supply 262 voltage may indicate that the sensing contact is open or closed. In another example embodiment, a value of approximately 10% of the full power supply 262 voltage may indicate that an internal interconnection 114 or cable wire has opened between the terminal board circuit 260 and the acquisition board circuit 266. In another example embodiment, a voltage value of approximately 20% of the full power supply 262 may indicate that wiring to the switch 202 has opened (where resistor Rx 204 is installed at the switch). According to example embodiments, the various resistors (204, 206, 208, 210, 212, 216, 218) may act to change the input circuit such that the contact controlled voltages have multiple values (typical values are shown in percentages since the threshold may be in proportion to the battery 214 or power supply 262 voltage). For example, the power supply reference 232 may provide the reference for comparison with the sensing input voltage 219. For example, when the sensing input voltage 219 is approximately the full power supply 262 voltage (approximately 100%), such a condition may represent a closed switch 202. In an example embodiment, when the sensing input voltage 219 is approximately 24% to 28% of the power supply 262 voltage, it may be indicative of an open switch 202 with the parallel resistor Rx 204 installed. In an example embodiment, when the sensing input voltage 219 is approximately 13% to approximately 17% of the full power supply 262 voltage, such a condition may represent an open wire to the contact or for an open switch 202 that does not include a parallel resistor Rx 204. In an example embodiment, when the sensing input voltage 219 is approximately 0% of the full power supply 262 voltage, such a condition may represent an internal connection cable 264 wire open between the terminal board circuit 260 and the acquisition board circuit 266.

In an example embodiment, the choice for the resistor values may be governed by current draw. For example, according to an embodiment, the values for the parallel resistors Rx 204 and Ry 208 may be set high enough to not make the open sensed voltage too high and to limit the current drawn through resistors Rx 204 and Ry 208. For example, if the resistance is too high, the open voltage for proper connection may not be very different from the open wire cases, making the detection threshold difficult to maintain. According to an example embodiment of the invention, the resistors Rx 204 and Ry 208 may be set at approximately 750K ohms. Other example embodiments include setting any of the resistance values anywhere from about 1K to about 1M ohm without departure from the scope of the invention.

According to example embodiments of the invention, the controller 268 may provide a series of comparison voltages to the reference voltage value input 221 for comparison via the DAC 222 with the sensing input voltage 219. In an example embodiment, the comparison voltages to the reference voltage value input 221 may be converted with a DAC 222. In another example embodiment, the controller 268 may be able to provide this as an analog signal. In an example embodiment, and based on the reference voltage value input 221, the comparator may be utilized to determine the relationship of the sensing input voltage 219 compared to different reference voltages. For example, the controller 268 may start by generating a first reference for presentation to the comparator 220 via the reference voltage value input 221. The comparison value output 223 may be evaluated as either being high or low, and the value may be recorded. Then, the controller 268 may generate a second reference (and so forth) for presentation to the comparator 220 via the reference voltage value input 221, and again, the comparison value output 223 may be evaluated as either being high or low and the value may be recorded. According to an example embodiment, the process may be repeated (for example, four times), and different references and field conditions may be evaluated. For example, if the sequence of comparison value outputs 223 are "Low-Low-Low-Low," then it may be indicative of wire fault (open) between the terminal board circuit 260 and the acquisition board circuit 266. According to an example embodiment, if the sequence of comparison value outputs 223 are "High-High-High-High," then it may be indicative of a closed switch 202, under normal operation. Such a sequence of four reference voltage value inputs 221 may be produced to evaluate five faults. In an example embodiment, an evaluation of three fault types may require a sequence of two reference voltage value inputs 221.

According to an example embodiment, multiple switches 202 and multiple associated field wires (209, 211) associated with the multiple switches 202 may be evaluated using circuits similar to those presented above, and in FIGS. 1 and 2, but with the addition of optional multiplexers. For example, such multiplexers may be inserted before the comparator circuit 220. In an example embodiment, multiple inputs (for example, multiple sensing input voltages 219) may be used as inputs to a multiplexer. In an example embodiment, the output of the multiplexer may provide input to the comparator 220. In an example embodiment, the switching sequence and timing of the multiplexer may be controlled by the controller 268.

Figure 3:
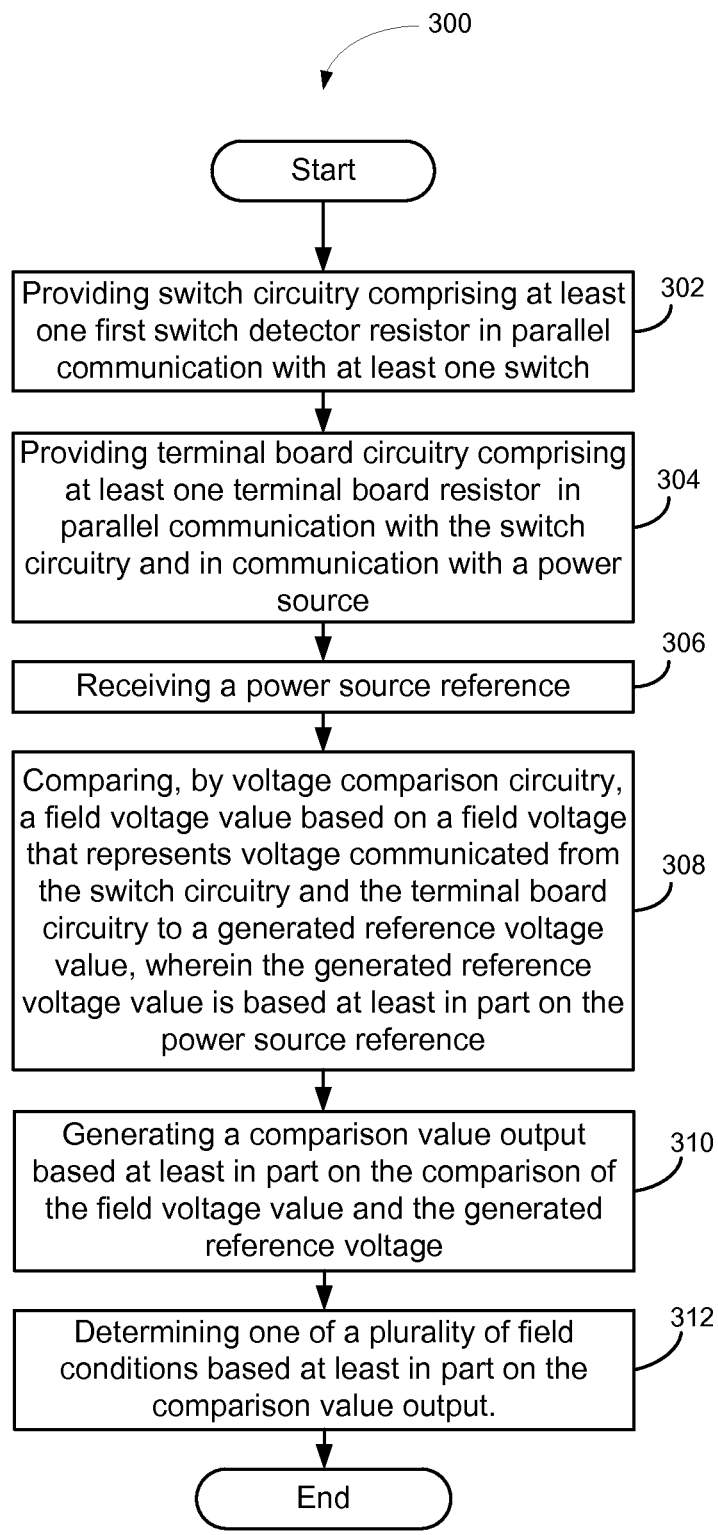
FIG. 3 is a flow diagram of an example method according to an example embodiment of the invention.

An example method 300 for determining electrical faults will now be described with reference to the flowdiagram of FIG. 3. The method 300 starts in block 302, and according to an example embodiment, includes providing switch circuitry comprising at least one first switch detector resistor in parallel communication with at least one switch.

In block 304, and according to an example embodiment, the method 300 includes providing terminal board circuitry comprising at least one terminal board resistor in parallel communication with the switch circuitry and in communication with a power source. In block 306, and according to an example embodiment, the method 300 includes receiving a power source reference. In block 308, and according to an example embodiment, the method 300 includes comparing, by voltage comparison circuitry, a field voltage value based on a field voltage that represents voltage communicated from the switch circuitry and the terminal board circuitry to a generated reference voltage value, wherein the generated reference voltage value is based at least in part on the power source reference. In block 310, and according to an example embodiment, the method 300 includes generating a comparison value output based at least in part on the comparison of the field voltage value and the generated reference voltage. In block 312, and according to an example embodiment, the method 300 includes determining one of a plurality of field conditions based at least in part on the comparison value output. The method 300 ends after block 312.

Example embodiments of the invention include determining one of the plurality of field conditions, where the determining is performed at least in part by a controller (118) comprising instructions and in communication with the voltage comparison circuitry (220). Example embodiments of the invention include switch circuitry (250), where the switch circuitry (250) further includes at least one second switch detector resistor (206) in series communication with the at least one switch (202).

Example embodiments of the invention include providing ground leakage detector circuitry (120) comprising leakage detection circuitry (228) in communication with the terminal board circuitry (110) and the controller (118), wherein the ground leakage detection circuitry (120) is in communication with the power source (112) and a first field conductor (209), and wherein the ground leakage detection circuitry (120) comprises a resistor network comprising at least a first divider resistor (224) and a second divider resistor (226) in series communication with a second field conductor (211) and having a ground connected between the first divider resistor (224) and the second divider resistor (226); generating one or more voltages with the ground leakage detector circuitry (120) wherein the one or more voltages respectively correspond to one or more conditions of: normal operation, a grounded first field conductor (209), or a grounded second field conductor (211); and determining the one or more conditions, based at least on the one or more voltages generated by the ground leakage detector circuitry (120). Example embodiments include determining a plurality of field conditions, wherein the plurality of field conditions comprises one or more of: (a) a wire open condition; (b) a switch open condition; (c) a switch closed condition; (d) a wire to wire short condition; (e) a grounded wire condition; (f) a wire fault between the terminal board circuitry and the acquisition board circuitry; or (g) a normal condition. Example embodiments include switching circuitry (202) wherein the switching circuitry (202) is operable to generate field voltage values (219) in response to each of the plurality of field conditions, which when compared by the voltage comparison circuitry (220) of the acquisition board circuitry (116) with respect to the generated reference voltage value (221) will generate an output (223) which can be utilized by the controller to determine the field conditions.

Figure 4:
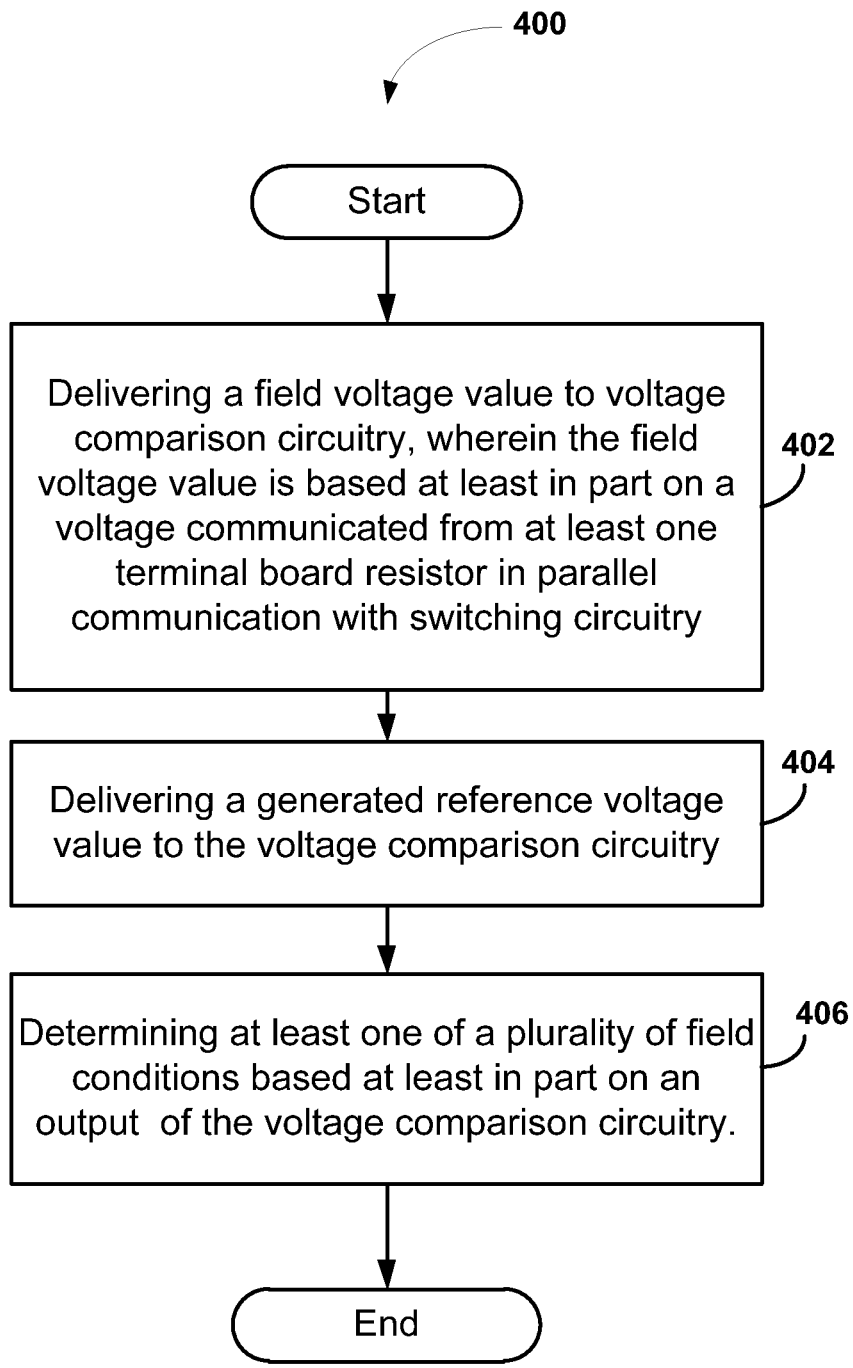
FIG. 4 is a flow diagram of another example method according to an example embodiment of the invention.

Another example method 400 for determining electrical faults will now be described with reference to the flowdiagram of FIG. 4. The method 400 starts in block 402, and according to an example embodiment, includes delivering a field voltage value to voltage comparison circuitry, wherein the field voltage value is based at least in part on a voltage communicated from at least one terminal board resistor in parallel communication with switching circuitry. In block 404, and according to an example embodiment, the method 400 includes delivering a generated reference voltage value to the voltage comparison circuitry. In block 406, and according to an example embodiment, the method 400 includes determining at least one of a plurality of field conditions based at least in part on an output of the voltage comparison circuitry. The method 400 ends after block 406.

Example embodiments of the invention include switching circuitry (250) wherein the switching circuitry (250) further includes at least one second switch detector resistor (206) in series communication with at least one switch (202), wherein the at least one second switch detector resistor (206) facilitates determining a field wire fault occurring between the at least one switch (202) and the at least one terminal board resistor (208). Example embodiments include receiving a plurality of field voltage values (219) at the voltage comparison circuitry (220), wherein each of the plurality of the field voltage values (219) is based at least in part on a voltage communicated from at least one of a plurality of terminal board resistors (208) in parallel communication with a corresponding plurality of switches (202); and determining at least one of a plurality of field conditions associated with the plurality of switches (202) based at least in part on the plurality of the field voltage values (219) and the generated reference voltage value (221), wherein the generated reference voltage value (221) is based at least in part on a power supply reference (232).

Example embodiments of the invention include a system for determining electrical faults. The system includes switch circuitry (104) comprising at least one first switch detector resistor (204) in parallel communication with at least one switch (202); terminal board circuitry (110) comprising at least one terminal board resistor (208) in parallel communication with the switch circuitry (104) and in communication with a power source (112); acquisition board circuitry (116) comprising voltage comparison circuitry (220) operable to receive a generated reference voltage value (221) as a first input and a field voltage value (219) as a second input and to output a comparison value (223), wherein the field voltage value (219) represents voltage communicated from the switch circuitry (104) and the terminal board circuitry (110); and a controller (118) comprising at least one processor and instructions, wherein the controller is adapted to: receive a power source reference (232); control the generated reference voltage value (221) to the voltage comparison circuitry (220) based at least in part on the power source reference (232); receive the comparison value output (223) from the voltage comparison circuitry (220); and determine one of a plurality of field conditions based at least in part on the comparison value (223).

Example embodiments of the switch circuitry (250) further comprise at least one second switch detector resistor (206) in series communication with the at least one switch (202). Example embodiments further include ground leakage detector circuitry (120) including a resistor divider circuit operable to generate a voltage and in series communication with the power source (112) and a first field conductor (209), wherein the resistor divider circuit comprises at least a first divider resistor (224) and a second divider resistor (226) in series communication with a second field conductor (211) and having a ground connected between the first divider resistor (224) and the second divider resistor (226). In example embodiments, the ground leakage detector circuitry (120) further includes leakage detection circuitry (228) in communication with the terminal board circuitry (110) and the controller (118), wherein the leakage detection circuitry (228) is operable to compare a voltage (209) associated with the switch circuitry (104) and one or more voltages associated with a ground (225). Example embodiments of the invention include the system wherein voltage generated across the ground leakage detector circuitry (120) corresponds to one or more of: normal operation, a grounded first field conductor (209); or a grounded second field conductor (211). Example embodiments of the system include a system wherein voltage generated across the ground leakage detector circuitry (120) corresponds to connectivity of one or more of: the first switch detector resistor (204), the second switch detector resistor (206), the first divider resistor (224), the second divider resistor (226), the first field conductor (209), or the second field conductor (211). Example embodiments of the system include acquisition board circuitry (116) including one or more of an analog-to-digital converter device or a digital-to-analog converter device. According to an example embodiment of the invention, the plurality of field conditions may include one or more of: (a) a wire open condition; (b) a switch open condition; (c) a switch closed condition; (d) a wire to wire short condition; (e) a grounded wire condition; (f) a wire fault between the terminal board circuitry and the acquisition board circuitry; or (g) normal operation. In an example embodiment, the switch circuitry (202) is operable to generate field voltage values (219) in response to each of the plurality of respective field conditions, which when compared by the voltage comparison circuitry (220) of the acquisition board circuitry (116) with respect to the generated reference voltage value (221) will generate an output (223) which can be utilized by the controller to determine the field conditions. In an example embodiment, the output (223) associated with a respective one of the plurality of field conditions represents a relative comparison of the field voltage value (219) to the generated reference voltage value (221), wherein the generated reference voltage value (221) is based at least in part on the power supply reference (232). In an example embodiment, the output (223) associated with a respective one of the plurality of field conditions represents a percentage of the generated reference voltage value (221) indicated by the respective field voltage value (219).

Accordingly, example embodiments of the invention can provide the technical effects of creating certain systems and methods that provide detection of field wire faults. Example embodiments of the invention can provide the further technical effects of providing systems and methods for determining ground fault detection.

In example embodiments of the invention, the fault detection system 100 and/or the fault detection circuit 200 may include any number of hardware and/or software applications that are executed to facilitate any of the operations.

In example embodiments, one or more input/output (I/O) interfaces may facilitate communication between the fault detection system 100 and/or the fault detection circuit 200 and one or more I/O devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the fault detection system 100 and/or the fault detection circuit 200. The one or more I/O interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the fault detection system 100 and/or the fault detection circuit 200 inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth™ (Owned by Telefonaktiebolaget LM Ericsson) enabled network, a Wi-Fi™ (owned by Wi-Fi Alliance)

enabled network, a satellite-based network, any wired network, any wireless network, etc., for communication with external devices and/or systems.

As desired, embodiments of the invention may include the fault detection system 100 and/or the fault detection circuit 200 with more or less of the components illustrated in FIGS. 1 and 2.

The invention is described above with reference to block and flow diagrams of systems and methods and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A system comprising:
    a power source;
    a first circuitry comprising:
        a switch; and
        a first resistor coupled to the power source and the switch in a first arrangement whereby a first current propagates through the first resistor when the switch is in an open condition;
    at least one interconnecting wire;
    a second circuitry coupled to the first circuitry via the at least one interconnecting wire, the second circuitry comprising:
        a second resistor coupled to the power source in a second arrangement whereby a second current is propagated through the second resistor; and
    an acquisition circuitry coupled to the second circuitry, the acquisition circuitry comprising:
        a current-to-voltage converting circuit that provides a first sensing voltage that is proportional to the first current and the second current; and
        a voltage comparator configured to receive the first sensing voltage as a first input and further configured to receive a reference voltage as a second input, and to output a first comparison value indicative of one of a normal condition or a fault condition of at least one of the first circuitry, the second circuitry, or the at least one interconnecting wire.

2. The system of claim 1, further comprising a third resistor coupled in series with a parallel combination of the switch and the first resistor, whereby the first current propagates through the third resistor when the switch is in the open condition, and a third current propagates through the third resistor when the switch is in a closed condition.

3. The system of claim 2, wherein the at least one interconnecting wire comprises a first wire and a second wire, and wherein the system further comprises:
    a ground leakage detection circuitry coupled to at least one of the first circuitry or the second circuitry, the ground leakage detection circuitry configured to detect one or more of: (a) a shorted condition between the first wire and ground, (b) a shorted condition between the second wire and ground, and (c) a shorted condition between the first wire and the second wire.

4. The system of claim 3, wherein the ground leakage detection circuitry comprises:
    a leakage comparator circuit; and
    a resistor divider circuit coupled to the differential inputs of the leakage comparator circuit, wherein an intermediate junction of the resistor divider network is connected to ground.

5. The system of claim 4, wherein the leakage comparator circuit provides an output voltage that is proportional to a differential input voltage provided by the resistor divider circuit to the leakage comparator circuit, the output voltage indicative of one of the normal condition or the fault condition, wherein the fault condition is indicated in reference to ground.

6. The system of claim 2, wherein the current-to-voltage converting circuit provides a second sensing voltage proportional to the second current and the third current, and wherein the voltage comparator outputs a second comparison value in response to the second sensing voltage, the second comparison value indicative of at least another one of a normal condition or a fault condition of the at least one of the first circuitry, the second circuitry, or the at least one interconnecting wire.

7. The system of claim 1, wherein the acquisition board circuitry further comprises one or more of an analog-to-digital converter or a digital-to-analog converter that provides a variable reference voltage to the voltage comparator.

8. The system of claim 1, wherein the at least one interconnecting wire comprises two or more wires, and wherein the one of the normal condition or the fault condition comprises one or more of: (a) a wire open condition; (b) a switch open condition; (c) a switch closed condition; (d) a wire to wire short condition; (e) a grounded wire condition; or (f) a wire fault condition.

9. The system of claim 1, wherein the current-to-voltage converting circuit comprises a fourth resistor configured to propagate the first current and the second current and provide therefrom, a voltage drop across the fourth resistor, the voltage drop across the fourth resistor constituting the first sensing voltage.

10. The system of claim 1:
wherein the first arrangement comprises the first resistor coupled in parallel to the switch,
wherein the second arrangement comprises the second resistor coupled in series with the power source,
wherein the fault condition of the at least one interconnecting wire comprises the at least one wire making contact with earth or chassis ground, and
wherein the normal condition comprises each of the switch, the first resistor, the second resistor, the third resistor, and the at least one wire having a lack of contact with earth or chassis ground.

11. The system of claim 1, further comprising:
a control circuit configured to automatically set the reference voltage to one of a plurality of threshold voltages, each of the plurality of threshold voltages selected to provide detection of a respective fault condition among a plurality of fault conditions associated with at least one of the first circuitry, the second circuitry, or the at least one interconnecting wire.

12. A method comprising:
generating a first current in a first resistor when a switch is in an open condition, the first resistor and the switch located in a first circuitry;
generating a reference current in a second resistor, the second resistor located in a second circuitry that is coupled to the first circuitry via at least one interconnecting wire;
combinedly propagating the first current and the reference current through a current-to-voltage converting circuit to generate a first sensing voltage; and
using a voltage comparator to compare the first sensing voltage to a reference voltage and produce a first output comparison value that is indicative of one of a normal condition or a fault condition in at least one of the first circuitry, the at least one interconnecting wire, or the second circuitry.

13. The method of claim 12, wherein the reference voltage is settable to one of a plurality of voltage amplitudes by a controller comprising executable instructions for selecting at least one of the plurality of voltage amplitudes.

14. The method of claim 12, wherein the first resistor is coupled in parallel with the switch and wherein the first circuitry further comprises a second resistor coupled in series with the switch.

15. The method of claim 12, further comprising:
using a ground leakage detector coupled to at least one of the first circuitry or the second circuitry to detect one or more of: (a) a shorted condition between ground and the at least one interconnecting wire, (b) an open condition in the at least one interconnecting wire, and (c) a shorted condition between a first wire and a second wire contained in the at least one interconnecting wire.

16. The method of claim 12, wherein the one of the normal condition or the fault condition comprises one or more of: (a) a wire open condition; (b) a switch open condition; (c) a switch closed condition; (d) a wire to wire short condition; or (e) a grounded wire condition.

17. The method of claim 12, further comprising:
generating a second current in the first resistor when the switch is in a closed condition;
combinedly propagating the second current and the reference current through the current-to-voltage converting circuit to generate a second sensing voltage; and
using the voltage comparator to compare the second sensing voltage to the reference voltage and produce a second output comparison value that is indicative of another one of the normal condition or the fault condition.

18. A method comprising:
generating a first sensing current through a series combination of a first resistor and a second resistor when a switch that is connected in parallel with the first resistor is in an open condition, wherein each of the first resistor, the second resistor and the switch is located in a first circuitry;
generating a second sensing current through the second resistor when the switch that is connected in parallel with the first resistor is in a closed condition;
generating a reference current in a third resistor, the third resistor located in a second circuitry that is coupled to the first circuitry via at least one interconnecting wire;
propagating at least one of the first sensing current or the second sensing current through a current-to-voltage converting circuit to generate a respective one of a first sensing voltage or a second sensing voltage; and
using a voltage comparator to compare at least one of the first sensing voltage or the second sensing voltage to a reference voltage and output from the voltage comparator, one of a respective first or a second output comparison result, wherein each comparison result is indicative of one of a normal condition or a fault condition in at least one of the first circuitry, the at least one interconnecting wire, or the second circuitry.

19. The method of claim 18:
wherein the fault condition of the at least one interconnecting wire comprises at least one wire making contact with earth or chassis ground, and
wherein the normal condition comprises each of the switch, the at least one wire, the first resistor, the second resistor, or the third resistor having a lack of contact with earth or chassis ground.

20. The method of claim 18, further comprising:
sequentially setting the reference voltage to a plurality of voltage values that are used for detecting a voltage amplitude of at least one of the first sensing voltage or the second sensing voltage;
interpreting the detected voltage amplitude of the at least one of the first sensing voltage or the second sensing voltage as a percentage value of a power supply voltage; and
using the interpretation to identify a specific fault condition in the at least one of the first circuitry, the at least one interconnecting wire, or the second circuitry.

* * * * *